(12) United States Patent
Cai et al.

(10) Patent No.: US 9,070,756 B2
(45) Date of Patent: Jun. 30, 2015

(54) GROUP III NITRIDE HIGH ELECTRON MOBILITY TRANSISTOR (HEMT) DEVICE

(71) Applicant: Suzhou Institute of Nano-Tech and Nano-Bionics of Chinese Academy of Science, Suzhou (CN)

(72) Inventors: Yong Cai, Suzhou (CN); Guohao Yu, Suzhou (CN); Zhihua Dong, Suzhou (CN); Baoshun Zhang, Suzhou (CN)

(73) Assignee: Suzhou Institute of Nano-Tech and Nano-Bionics of Chinese Academy of Sciences, Suzhou (CN)

( * ) Notice: Subject to any disclaimer, the term of this patent is extended or adjusted under 35 U.S.C. 154(b) by 0 days.

(21) Appl. No.: 14/357,911

(22) PCT Filed: Nov. 16, 2012

(86) PCT No.: PCT/CN2012/001552
§ 371 (c)(1),
(2) Date: May 13, 2014

(87) PCT Pub. No.: WO2013/071699
PCT Pub. Date: May 23, 2013

(65) Prior Publication Data
US 2014/0319584 A1 Oct. 30, 2014

(30) Foreign Application Priority Data

Nov. 18, 2011 (CN) .......................... 2011 1 0366992
Nov. 18, 2011 (CN) .......................... 2011 1 0367070
Nov. 18, 2011 (CN) .......................... 2011 1 0367190

(51) Int. Cl.
*H01L 29/66* (2006.01)
*H01L 29/778* (2006.01)
(Continued)

(52) U.S. Cl.
CPC ........ *H01L 29/778* (2013.01); *H01L 29/42316* (2013.01); *H01L 29/7787* (2013.01); *H01L 29/1029* (2013.01); *H01L 29/2003* (2013.01)

(58) Field of Classification Search
CPC ............ H01L 29/778; H01L 29/42316; H01L 29/7787; H01L 29/1029; H01L 29/2003
USPC ......................................................... 257/194
See application file for complete search history.

(56) References Cited

U.S. PATENT DOCUMENTS

2005/0253168 A1* 11/2005 Wu et al. ........................ 257/192
2009/0242937 A1* 10/2009 Marui et al. ................... 257/192
(Continued)

FOREIGN PATENT DOCUMENTS

CN           101232045 A      7/2008
(Continued)

*Primary Examiner* — Victor A Mandala
(74) *Attorney, Agent, or Firm* — Wang Law Firm, Inc.; Li K. Wang; Stephen Hsu

(57) ABSTRACT

A group III nitride high electron mobility transistor (HEMT) device comprises a source electrode (112), a drain electrode (111), a main gate (116), a top gate (118), an insulating dielectric layer (117) and a heterostructure, wherein the source electrode (112) and the drain electrode (111) are electrically connected via two-dimensional electron gas (2DEG) formed in the heterostructure; the heterostructure comprises a first semiconductor (113) and a second semiconductor (114); the first semiconductor (113) is disposed between the source electrode (112) and drain electrode (111); the second semiconductor (114) is formed on the surface of the first semiconductor (113) and is provided with a band gap wider than the first semiconductor (113); the main gate (116) is disposed at the side of the surface of the second semiconductor (114) adjacent to the source electrode (112), and is in Schottky contact with the second semiconductor (114); the dielectric layer (117) is disposed on the surfaces of the second semiconductor (114) and the main gate (116) and between the source electrode (112) and the drain electrode (111); the top gate (118) is formed on the surface of the dielectric layer (117), at least one side edge of the top gate extends towards the direction of the source electrode (112) or the drain electrode (111), and the orthographic projection of the top gate overlaps with the two side edges of the main gate (116). When the HEMT device is at work, the main gate (116) and the top gate (118) are respectively controlled by a control signal. The device can effectively inhibit the "current collapse effect".

9 Claims, 13 Drawing Sheets

(51) Int. Cl.
  *H01L 29/423* (2006.01)
  *H01L 29/10* (2006.01)
  *H01L 29/20* (2006.01)

(56) References Cited

U.S. PATENT DOCUMENTS

2010/0102357 A1* 4/2010 Sato .............................. 257/192
2011/0049526 A1* 3/2011 Chu et al. ........................ 257/76
2011/0133251 A1 6/2011 He
2011/0284928 A1* 11/2011 Shibata et al. ................. 257/195
2013/0105808 A1* 5/2013 Wong et al. ..................... 257/76

FOREIGN PATENT DOCUMENTS

| CN | 101276837 A | 10/2008 |
| CN | 102403349 A | 11/2011 |
| CN | 102420247 A | 11/2011 |
| CN | 102427085 A | 11/2011 |

* cited by examiner

GROUP III NITRIDE HIGH ELECTRON MOBILITY TRANSISTOR (HEMT) DEVICE

RELATED APPLICATION

This application claims the benefit of Chinese patent applications, 201110367190.7, 201110367070.7, and 201110366992.6, all filed on Nov. 18, 2011, and a PCT application WO2013/071699 A1, filed on Nov. 16, 2012, the specifications of which are incorporated here by this reference.

TECHNICAL FIELD

The invention relates to a high electron mobility transistor (HEMT), in particular to a group III nitride high electron mobility transistor (HEMT) device.

BACKGROUND OF THE INVENTION

When the HEMT device adopts the group III nitride semiconductor, the two-dimensional electron gas with a high concentration can be formed in the heterostructure, such as AlGaN/GaN, due to the piezoelectric polarization and spontaneous polarization effect. In addition, the HEMT device can obtain very high electric field strength for dielectric breakdown, and a good characteristic of high temperature resistance by adopting the group III nitride semiconductor. The group III nitride semiconductor HEMT device with a heterostructure can be used as a high frequency device, and is applicable for high-voltage/high-current power switching devices.

When the existing group III nitride semiconductor HEMT device is used as a high frequency device, or a high-voltage and high-power switching device, the output current of the drain electrode is often unable to keep up with the changes of the gate control signal, a large turn-on transient delay is caused, that is a "current collapse phenomenon" on the group III nitride semiconductor HEMT device, which seriously impacts the practicality of the device. The existing comparatively acknowledged perception on the "current collapse phenomenon" is "virtual gate model". In the "Virtual gate model", when the device is in a turn-off state, an electron is injected into the surface of the semiconductor, so as to form as a virtual gate with a negative charge through surface state or defect capture. The virtual gate with a negative charge will reduce the channel electron in the gate-drain and gate-source access region due to electrostatic induction. When the device is transformed from a turn-off state into a turn-on state, although the channel under the gate can quickly accumulate a large number of electrons, the charge in the virtual gate cannot be timely released. The concentration of channel electron under the gate is low, so the output current at the drain end is small. Only when the charge in the virtual gate is fully released, the current at the drain end can be restored to a level of the DC state. At present, the ordinary used methods for suppressing "current collapse" comprise: reducing the density of surface state or interface state by performing the surface treatment on the semiconductor, reducing the electric field strength of the gate electrode adjacent to one end of the drain electrode through a field plate structure, reducing the probability of electron captured by defects, and suppressing the current collapse. However, the effect of the method of suppressing the current collapse under a high current and a high voltage is not ideal.

SUMMARY OF THE INVENTION

The purpose of the invention is to provide the group III nitride HEMT device, which has a laminated dual-gate structure, wherein the two-dimensional electron gas (2DEG) is regulated by interaction of the top gate and the main gate, so that the output current of the drain end of HEMT device can keep up with the changes of the gate voltage, thereby more effectively suppressing the "current collapse effect".

To fulfill the purpose, the invention adopts the following technical scheme:

The group III nitride high electron mobility transistor (HEMT) device comprises a source electrode, a drain electrode and a heterostructure, wherein the source electrode and the drain electrode are electrically connected through two-dimensional electron gas (2DEG) formed in the heterostructure; the heterostructure comprises a first semiconductor and a second semiconductor; the first semiconductor is arranged between the source electrode and drain electrode; the second semiconductor is formed on the surface of the first semiconductor and is provided with a band gap wider than the first semiconductor; the high electron mobility transistor (HEMT) device also comprises a main gate, a top gate and an insulating dielectric layer.

The main gate is arranged at the side of the surface of the second semiconductor adjacent to the source electrode, and is in Schottky contact with the second semiconductor;

The dielectric layer is arranged on the surfaces of the second semiconductor and the main gate and between the source electrode and the drain electrode;

The top gate is formed on the surface of the dielectric layer, at least one side edge of the top gate extends towards the direction of the source electrode or the drain electrode, and the orthographic projection of the top gate overlaps with the two side edges of the main gate.

When the HEMT device is at work, the main gate and the top gate are respectively controlled by a control signal.

As one aspect of the invention, the dielectric layer comprises a first dielectric layer and a second dielectric layer;

The first dielectric layer is formed on the surface of the second semiconductor;

The second dielectric layer is formed on the first dielectric layer and the surface of the main gate;

The main gate is arranged at the side of the surface of the first dielectric layer adjacent to the source electrode, and forms a metal-insulator-semiconductor structure with the first dielectric layer and the second semiconductor;

The top gate is formed on the surface of the dielectric layer, at least one side edge of the top gate extends towards the direction of the source electrode or the drain electrode, and the orthographic projection of the top gate overlaps with the two side edges of the main gate.

As another aspect of the group III nitride high electron mobility transistor (HEMT) device, the local region of the second semiconductor under the main gate also forms a plasma processing region.

Preferably, the plasma processing region is a fixed negative charge region formed by performing a fluorine plasma treatment on the local region in the second semiconductor.

Further speaking, the plasma processing region is a fixed negative charge region formed by performing a fluorine plasma treatment on the second semiconductor through reactive-ion etching (RIE) or inductively coupled plasma etching (ICP) and other processes, depleting the two-dimensional electron gas in a corresponding channel.

The source electrode and the drain electrode are respectively connected to the low potential and the high potential of the power supply.

The first semiconductor and the second semiconductor adopt the group III nitride semiconductors.

Two side edges of the top gate respectively extend towards the directions of the source electrode and the drain electrode, or only one side edge of the top gate extends towards the direction of a corresponding source electrode or drain electrode.

When the HEMT device is at work, the potential of a control signal of the top gate is higher than that of a control signal of the main gate.

BRIEF DESCRIPTION OF THE DRAWINGS

FIG. 1-1 is a cross-sectional structure diagram of the HEMT device with a laminated dual-gate structure in the embodiment 1 of the invention;

FIG. 1-2 is a local structure diagram of HEMT device with a laminated dual-gate structure in the embodiment 1 of the invention;

FIG. 1-3 is a structure diagram of a typical HEMT device in the embodiment 1 of the invention, wherein the top gate extends towards the directions of the source electrode and the drain electrode;

FIG. 1-4 is a structure diagram of another typical HEMT device in the embodiment 1 of the invention, wherein the top gate only extends towards the direction of the drain electrode;

FIG. 2-1 is a cross-sectional structure diagram of MISHEMT with a laminated dual-gate structure of the embodiment 2 of the invention;

FIG. 2-2 is a local structure diagram of MISHEMT device with a laminated dual-gate structure in the embodiment 2 of the invention;

FIG. 2-3 is a structure diagram of a typical MISHEMT device in the embodiment 2 of the invention, wherein the top gate extends towards the directions of the source electrode and the drain electrode;

FIG. 2-4 is a structure diagram of another typical MISHEMT device in the Embodiment 2 of the invention, wherein the top gate only extends towards the direction of the drain electrode;

FIG. 3-1 is a cross-sectional structure diagram of E-MODE HEMT with a laminated dual-gate structure in the embodiment 3 of the invention;

FIG. 3-2 is a local structure diagram of E-MODE HEMT device with a laminated dual-gate structure in the embodiment 3 of the invention;

FIG. 3-3 is a structure diagram of a typical E-MODE HEMT device in the Embodiment 3 of the invention, wherein the top gate extends towards the directions of the source electrode and the drain electrode;

FIG. 3-4 is a structure diagram of another typical E-MODE HEMT device in the embodiment 3 of the invention, wherein the top gate only extends towards the direction of the drain electrode;

FIG. 4-1 is a cross-sectional structure diagram of enhanced MISHEMT with a laminated dual-gate structure in the embodiment 4 of the invention;

FIG. 4-2 is a local structure diagram of enhanced MISHEMT device with a laminated dual-gate structure in the Embodiment 4 of the invention;

FIG. 4-3 is a structure diagram of a typical enhanced MISHEMT device in the embodiment 4 of the invention, wherein the top gate extends towards the directions of the source electrode and the drain electrode;

FIG. 4-4 is a structure diagram of another typical enhanced MISHEMT device in the embodiment 4 of the invention, wherein the top gate only extends towards the direction of the drain electrode;

DETAILED DESCRIPTION

Figure 1:
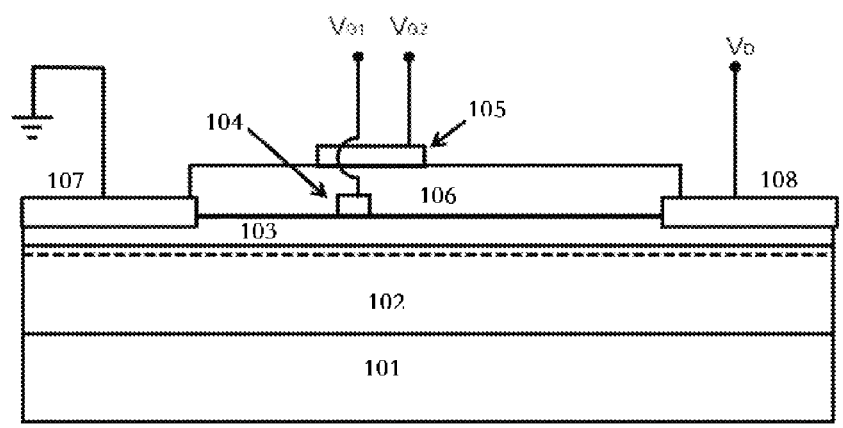
FIGS. 1-4 are local structure diagrams of ordinary HEMT, MISHEMT, E-MODE HEMT and Enhanced MISHEMT device respectively.

For ordinary HEMT, MISHEMT, E-MODE HEMT and E-MODE MISHEMT devices (for example, AlGaN/GaN devices), reasons of the current collapse phenomenon are roughly: referring to the FIGS. I-IV, when the device is in a turn-off state, the interfaces of an AlGaN layer (a second semiconductor 03) and an insulating dielectric layer 06 at two sides of metals of the gate (a main gate 04), an insulating dielectric layer 09, a first dielectric layer 010 or an insulating dielectric layer 012 will accumulate negative charges to form negative charge accumulation region 021, wherein the negative charges will reduce or completely deplete the two-dimensional electron gas in the channel region beneath due to electrostatic induction effect. When the gate voltage rises, and the device is transformed from a turn-off state into a turn-on state, the two-dimensional electron gas under the gate increases due to the voltage control of the gate, the channel under the gate is turned on, but negative voltages in the interface charge accumulation region cannot be timely released due to the deeper energy level, so two-dimensional electron gas under the channel is less, and the device cannot be fully turned on. As time goes, negative voltages in the interface charge accumulation region can be released from deep energy level, the electron density under the channel increases, and the device is gradually transformed into fully turned on. According to results of the present study, the time to release negative charge from deep energy level reaches a quantity level of microseconds through couple seconds.

Referring to FIGS. I-IV, other components and attached diagrams are respectively marked as follows: a substrate 01, a first semiconductor 02, a top gate 05, a source electrode 07, a drain electrode 08 and a fixed negative charge region 011.

For the purpose, the inventor provides a new group III nitride high electron mobility transistor (HEMT) device. In order to enable the public to have a better understanding of the technical skills of the invention and implement in accordance with the contents of the manual description, combined with various specific embodiments, further explanation on the technical solutions of the invention is made as follows:

Embodiment 1

Referring to FIG. 1-1, the embodiment relates to a group III nitride high electron mobility transistor (HEMT) device with a laminated dual-gate structure (hereinafter referred to as "a laminated dual-gate device"), wherein a source electrode 107 and a drain electrode 108 are arranged at two sides; the surface of a second semiconductor 103 (such as AlGaN layer)

adjacent to a source electrode 107 is a gate electrode, called a main gate 104; an insulating dielectric layer 106 (such as Si3N4) is arranged on the top of the main gate, and the top of the insulating dielectric layer is another gate electrode, called a top gate 105. As shown in FIG. 1, the top gate is arranged above the main gate, overlapping with two side edges of the main gate in the orthographic projection and extending towards the directions of the source electrode and the drain electrode. The first semiconductor 102 (such as GaN layer) can be arranged on a substrate 101 (such as sapphire, silicon carbide and silicon, etc.)

Figure 2:
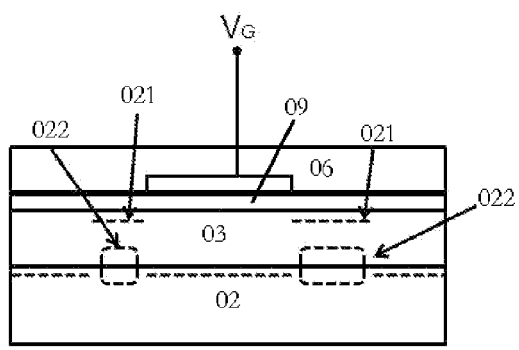

Referring to FIG. 1-2, when the laminated dual-gate device is in a turn-off state, a main gate 104 is disposed biased to below the threshold voltage, a top gate 105 is applied with sufficiently high positive bias; although the interface of a second semiconductor 103 at two metal sides of the main gate and an insulating dielectric layer 106 will also accumulate negative charges (form negative charge accumulation region 121), the electric field of the top gate cannot be completely shielded by interface negative charges because of sufficiently high forward bias on the top gate; enough electric field is present to induce the two-dimensional electron gas in the channel and keep the channel under the charge accumulation region to be turned on (form channel turn-on region 123); when the voltage of the main gate rises, and the device is transformed from a turn-off state into a turn-on state, the voltage of the top gate remains constant, and the channel under the interface charge accumulation region is turned on, so the device cannot cause delay due to current collapse.

If the device operates in a switching mode, the drive mode of the laminated dual-gate device can be adopted: pulse signals are synchronically applied for the main gate and top gate; the voltage of top gate is higher than that of the main gate; when the device is transformed from a turn-off state into a turn-on state, a high voltage of the top gate can overcome the shield of the interface negative charges and forcedly induce enough two-dimensional electron gas to avoid the current collapse. It is worth noting that, in a turn-off state, the bias of the top gate can be independent of the main gate, choosing the right bias of top gate in a turn-off state, thus the device can get a better breakdown voltage.

Figure 1:
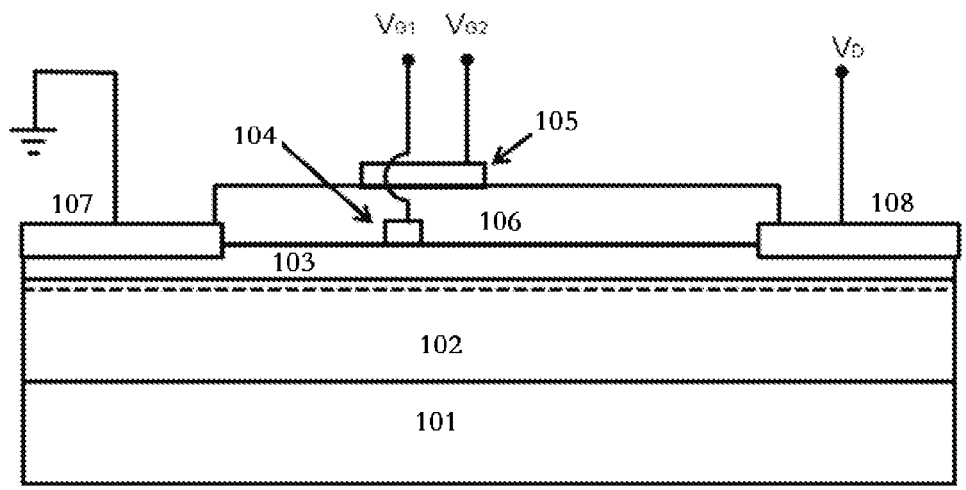
Figures 1, 2:
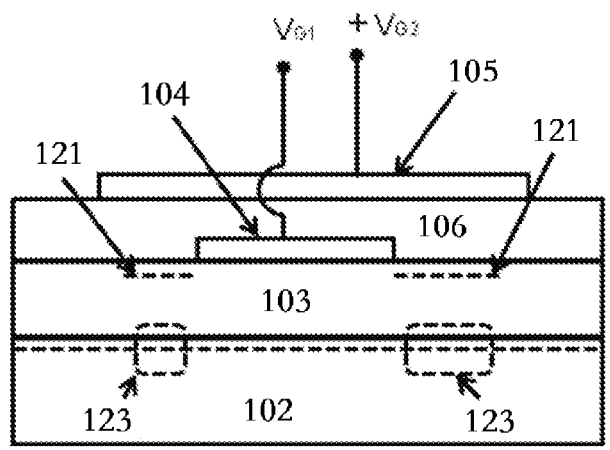
Figures 1, 2, 3:
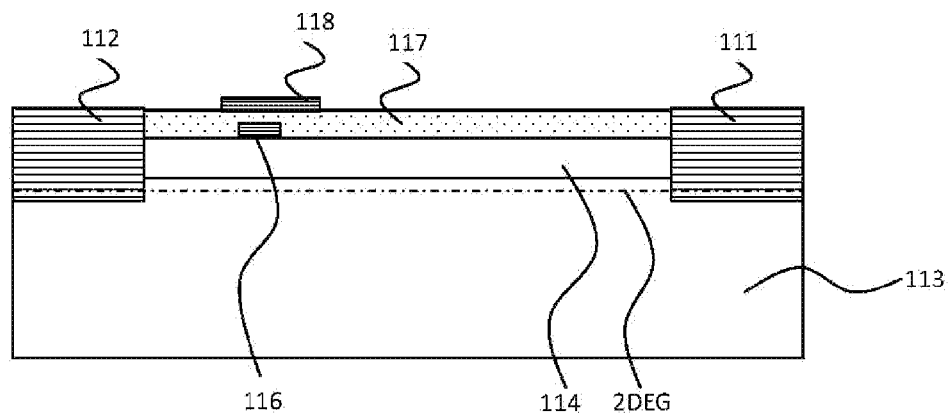

Referring to FIG. 1-3, as a preferred scheme in the embodiment, the laminated dual-gate device comprises a first semiconductor 113 (GaN) and a second semiconductor 114 (AlGaN) which is formed on the first semiconductor 113. The first semiconductor 113 is not purposefully doped. An n-type impurity may be doped or not be doped in the second semiconductor 114. The band gap of the second semiconductor 114 is wider than that of the first semiconductor 113. The thickness of the second semiconductor 114 is about 15 to 30 nm. The heterostructure comprises the first semiconductor 113 and the second semiconductor 114, forming the two-dimensional electron gas (2DEG) at the interface.

The laminated dual-gate device comprises a drain electrode 111 and a source electrode 112 that are configured by spacing distance. A drain electrode 111 and a source electrode 112 go through the second semiconductor 114 and extend towards the direction of the first semiconductor 113, and are electrically connected with two-dimensional electron gas (2DEG) in the channel. The drain electrode 111 and the source electrode 112 form an ohmic contact by multiple layers of metal (such as: Ti/Al/Ti/Au or Ti/Al/Ni/Au, etc.) through rapid high temperature annealing.

Further, the laminated dual-gate device comprises a main and top dual gate structure; the main gate 116 is manufactured between the source electrode and drain electrode adjacent to one end of the source electrode; the main gate 116 is in direct contact with the surface of the second semiconductor 114, and is in Schottky contact with the second semiconductor. The top gate 118 is arranged on the insulating dielectric layer 117 (such as Si3N4), and the orthographic projection overlaps with the main gate, and extends towards the directions of the source electrode and the drain electrode (or only extends towards the direction of the source electrode or the drain electrode; FIG. 1-4 shows a structure in which only extends towards the direction of the drain electrode).

The working principle of the laminated dual-gate device is as follows: because the band gap of the second semiconductor 114 is wider than that of the first semiconductor 113, the two-dimensional electron gas (2DEG) layer is formed on the heterojunction interface of the first semiconductor 113 and the second semiconductor 114. The two-dimensional electron gas (2DEG) exists on one side of the first semiconductor 113 of the heterojunction interface.

When the main gate 116 is applied with a high potential, the concentration of the two-dimensional electron gas in the channel is high, and the device is in a turn-on state; When the main gate 116 is applied with a low potential, the two-dimensional electron gas in the channel is depleted, and the device is in a turn-off state; therefore, the concentration of the two-dimensional electron gas in a corresponding channel of the main gate 116 is controlled by controlling the potential of the main gate 116, so that the switching state of the device channel is controlled.

Independent electrical signal control is applied for the top gate 118. The concentration of the two-dimensional electron gas on two sides of the channel of the main gate 116 can be controlled through applying different electrical signals for the top gate 118.

Figure 5:
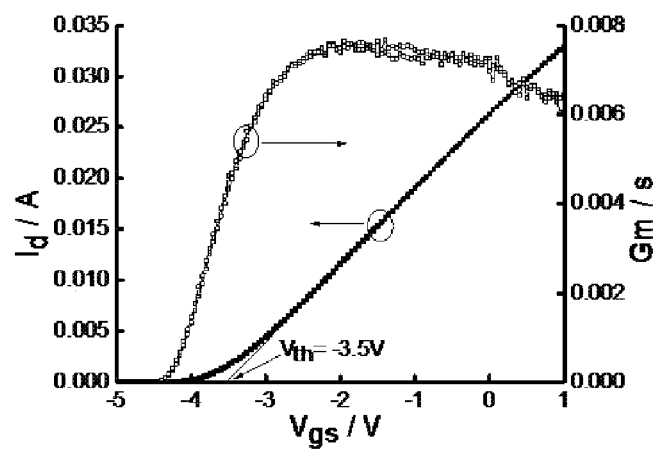
FIG. 5 is a transform characteristic curve graph of the dual-gate HEMT device in the embodiment 1 of the invention.
Figure 6:
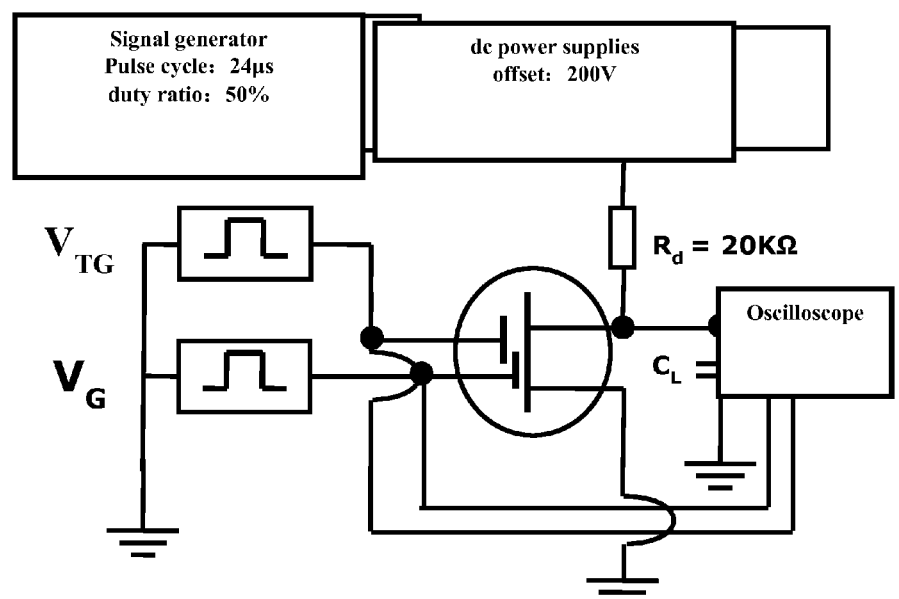
FIG. 6 is a dynamic test circuit diagram of the dual-gate HEMT device in the embodiment 1 of the invention.

Based on the above preferred scheme, the inventor has designed and prepared a dual-gate HEMT device with a topgate structure, wherein the gate-source space is 5 um, the gate-drain space is 12 um, the gate length is 2 um, and the gate width is 100 um; the dielectric layer between the gate electrode and a top gate electrode is SiN with a thickness of 165 nm; the gate electrode is completely covered by the top gate, which extends towards the side of the source terminal with a length of 2 um, and extends towards the side of the drain terminal with a length of 4 um. The threshold voltage of the device is −3.5V, shown in FIG. 5. Based on the transfer characteristic curve, the present invention has carried out the following research of dynamic characteristics of the dual-gate HEMT device, shown in FIG. 6. For the dual-gate HEMT device, the drain voltage is 200V, the load resistance 20 KΩ, and the circuit load capacitance is 106PF; the gate electrode and the top gate electrode are respectively controlled by twoway pulse source, while the input and output signals of the dual-gate HEMT device are monitored by an oscilloscope.

Figure 7:
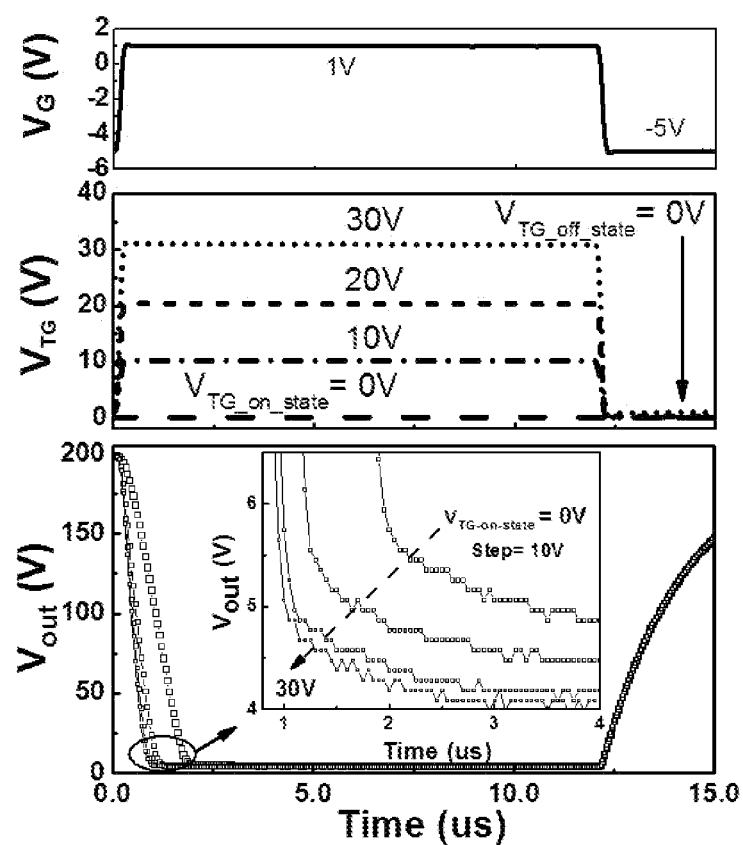
FIGS. 7 and 8 are respectively working performance curve graphs when the dual-gate HEMT device in the embodiment 1 of the invention is in a turn-on state and a turn-off state. As you can see from the graphs, when the device is in the turn-on state, higher voltage on the top gate is, a corresponding turn-on resistance is lower; when the device is in the turn-off state, lower negative voltage on the top gate is, and the corresponding dynamic turn-on resistance is lower.
Figure 8:
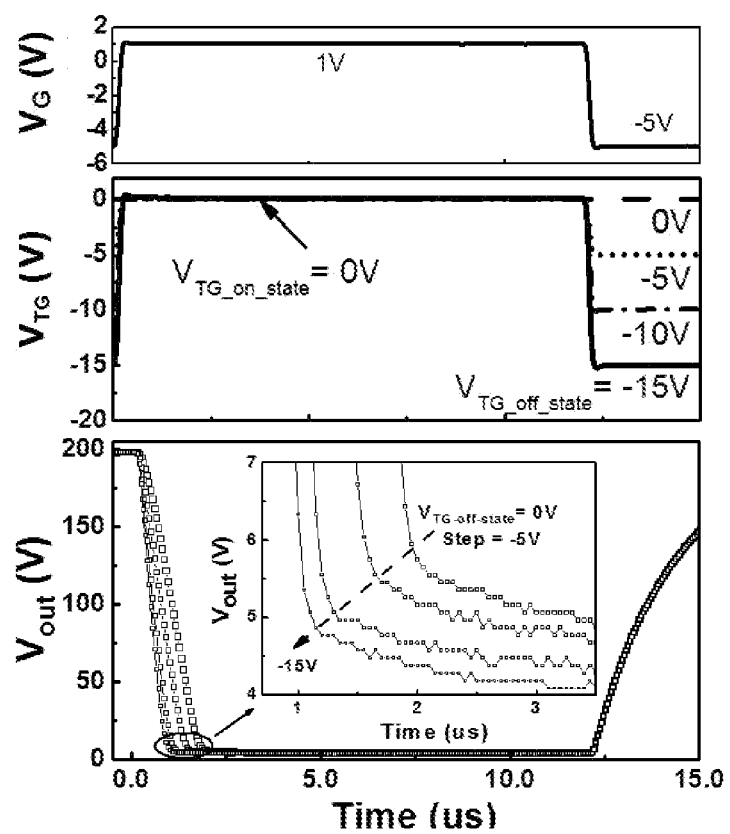

The inventor has researched the impact of the voltage applied by the top gate of the dual-gate HEMT device in a turn-on state and a turn-off state on the dynamic turn-on resistance of the device. The time used for the voltage of an output end of the device dropping from the highest value to the peak reduced value of 90 percent herein is defined as the delay time $T_{fd}$; the dynamic average resistance from the delay to the turn-off time herein is defined as the dynamic turn-on resistance $R_{on\_D}$. The results show that: when the dual-gate HEMT devices is at work under a dynamic condition, and the device is in a turn-on state, the positive voltage applied on the top gate is larger, the dynamic resistance of the device is smaller, FIG. 7 indicates that a positive voltage of the top gate can induce an electron in the channel; if the voltage of the top gate is 30V, the dynamic turn-on resistance can be reduced by 17%, and the delay time can be reduced by 55%, shown in Table 1; when the device is in a turn-off state, lower the negative voltage applied on the top gate is, the dynamic resistance of the device is smaller, FIG. 8 indicates that a negative voltage of the top gate can suppress the capture of the electron by the surface state and defect under the top gate between the gate and drain electrode, thereby reducing the virtual gate effect and improving the dynamic characteristics of the device; if the voltage of the top gate is −15V, the dynamic turn-on resistance can be reduced by 16%, and the delay time can be reduced by 50%, shown in Table 2.

TABLE 1

Relations between $\tau_{fd}$ and $R_{on\_D}$ and the voltage of top gate in a turn-on state

| $V_{TG\text{-}on\text{-}state}$ (V) | $\tau_{fd}$ (μs) | $R_{on\_D}$ (Ω) |
|---|---|---|
| 0 | 1.6 | 500 |
| 10 | 0.94 | 460 |
| 20 | 0.78 | 430 |
| 30 | 0.72 | 415 |

TABLE 2

Relations between τfd and Ron_D and the voltage of top gate in a turn-off state

| $V_{TG\text{-}off\text{-}state}$ (V) | $\tau_{fd}$ (μs) | $R_{on\_D}$ (Ω) |
|---|---|---|
| 0 | 1.6 | 500 |
| −5 | 1.25 | 480 |
| −10 | 0.93 | 440 |
| −15 | 0.8 | 420 |

Embodiment 2

Referring to FIG. 2-1, the embodiment relates to a group III nitride metal-insulator-semiconductor high electron mobility transistor (MISHEMT) device with a laminated dual-gate structure (hereinafter referred to as the "MISHEMT device"), wherein the source electrode 207 and the drain electrode 208 are arranged on two sides; the surface of a first semiconductor 209 (such as Al2O3) adjacent to one side of a source electrode 207 is a gate electrode, called a main gate 204; the second dielectric layer 206 (such as $Si_3N_4$) is arranged on the top of the main gate, and the top of the second insulating dielectric layer is another gate electrode, called a top gate 205. As shown in FIG. 2-1, the top gate is arranged above the main gate, overlaps on the orthographic projection plane with two side edges of the main gate and extends to a certain degree towards the directions of source electrode and the drain electrode. The first semiconductor 202 (such as GaN layer) can be arranged on a substrate 201 (such as sapphire, silicon carbide and silicon, etc.)

Referring to FIG. 2-2, when the MISHEMT device is in a turn-off state, a main gate 204 is biased below the threshold voltage, a top gate 205 is applied with sufficiently high positive bias; although the interface of a second semiconductor 203 at both sides of the metal of the main gate and an insulating dielectric layer 209 can also accumulate negative charges (form negative charge accumulation region 221), the electric field of the top gate cannot be completely shielded by interface negative charges because of high enough forward bias on the top gate; enough electric field is present to induce the two-dimensional electron gas in the channel so as to keep the channel under the charge accumulation region to be turned on (form a channel turn-on region 223); when the voltage of the main gate rises, and the device is transformed from a turn-off state into a turn-on state, the voltage of the top gate remains constant, and the channel under the interface charge accumulation region is still turned on, so the device cannot cause delay due to current collapse.

If the device operates in a switching mode, the drive mode of the MISHEMT device can be adopted: pulse signals are synchronically applied for the main gate and top gate; the voltage of top gate is higher than that of the main gate; when the device is transformed from a turn-off state into a turn-on state, a high voltage of the top gate can overcome the shield of the interface negative charges and forcedly induce enough two-dimensional electron gas to avoid the current collapse. It is worth noting that, in a turn-off state, the bias of the top gate can be independent with the main gate, choosing the proper bias of top gate in a turn-off state, thus the device can get a better breakdown voltage.

Referring to FIG. 2-3, as a preferred scheme in the embodiment, the MISHEMT device comprises a first semiconductor 213 (GaN) and a second semiconductor 214 (AlGaN) which is formed on the first semiconductor 213. The first semiconductor 213 is not purposely doped. In the second semiconductor 214, an n-type impurity may be doped, or not be doped. The crystal of the second semiconductor 214 contains aluminum. The band gap of the second semiconductor 214 is wider than that of the first semiconductor 213. The thickness of the second semiconductor 214 is about 15 to 30 nm. The heterostructure comprises a first semiconductor 213 and a second semiconductor 214, and the two-dimensional electron gas (2DEG) is formed at an interface.

The MISHEMT device comprises a drain electrode 211 and a source electrode 212 that are arranged at a prescribed spacing distance. The drain electrode 211 and the source electrode 212 go through the second semiconductor 214 and extend to the first semiconductor 213, and are electrically connected with two-dimensional electron gas (2DEG) in the channel. The drain electrode 211 and the source electrode 212 form an ohmic contact by multiple layers of metal (such as: Ti/AL/Ti/Au or Ti/Al/Ni/Au etc.) through rapid high temperature annealing.

Figures 1, 2, 3, 4:
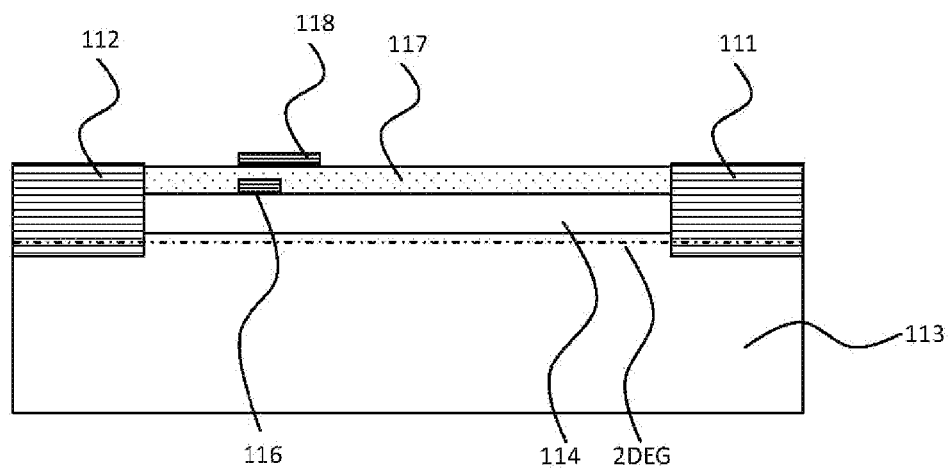
Figures 1, 2:
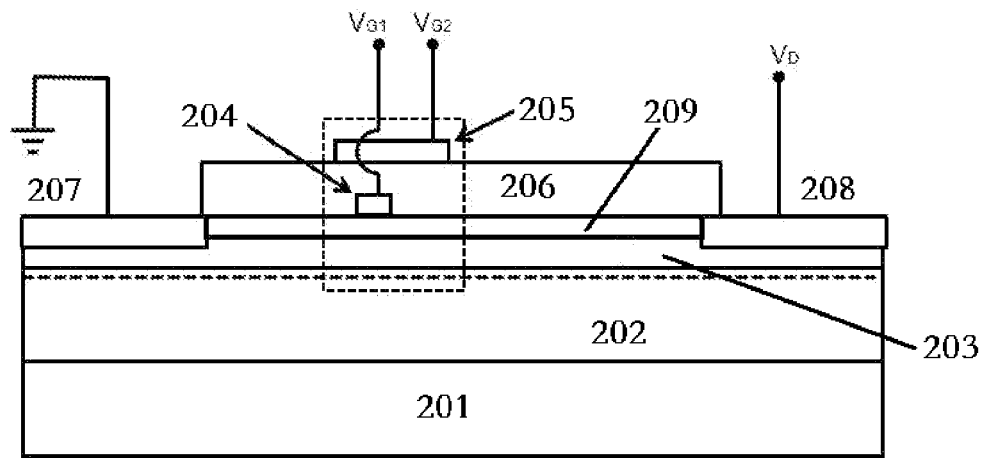
Figure 2:
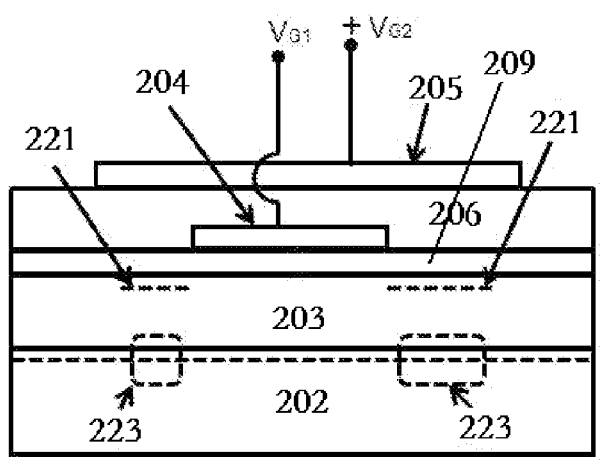
Figures 2, 3:
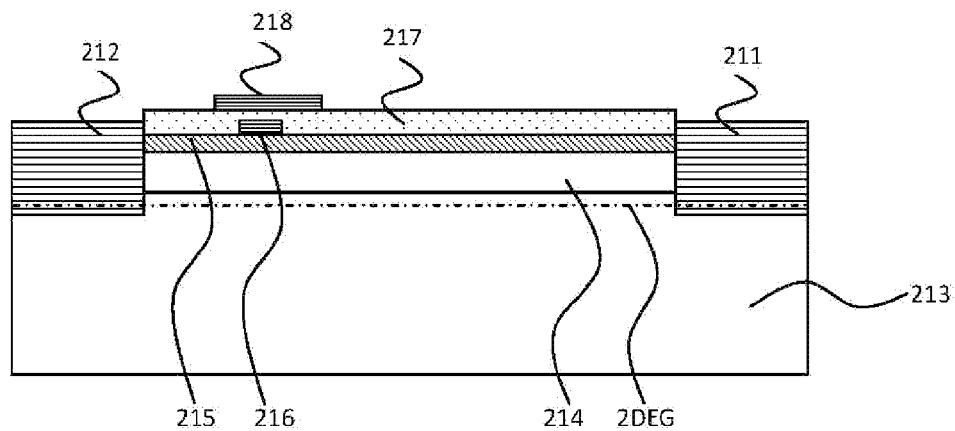
Figures 2, 3, 4:
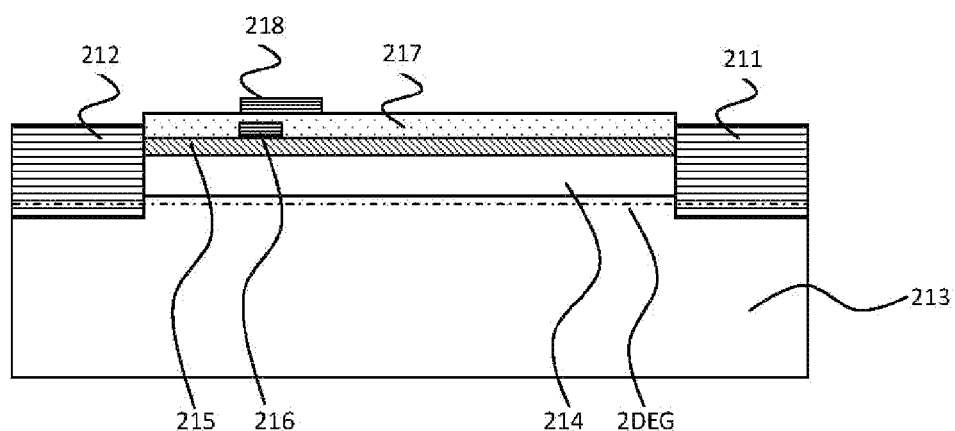
Figure 3:
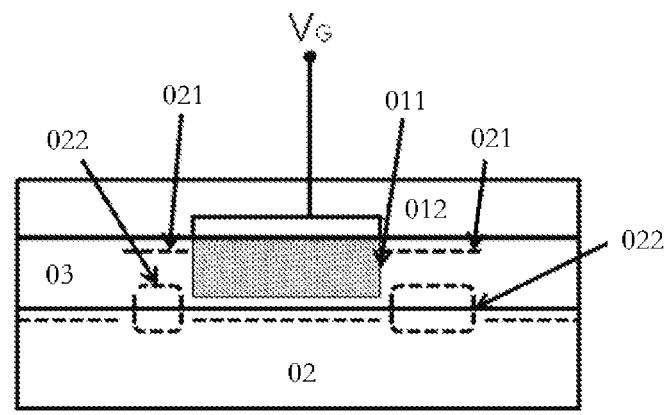
Figure 4:
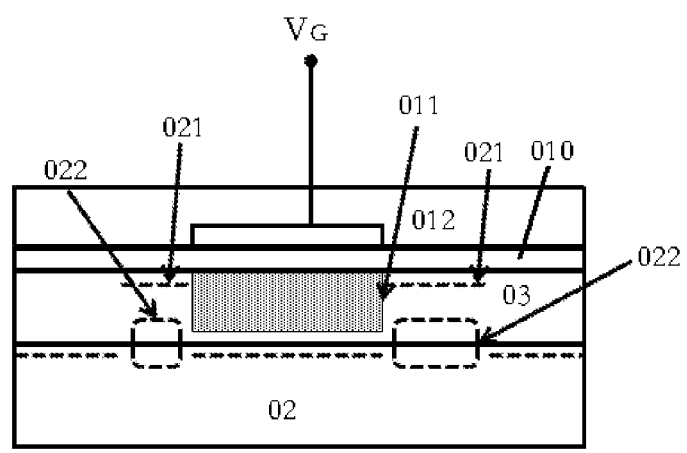
Figures 1, 3:
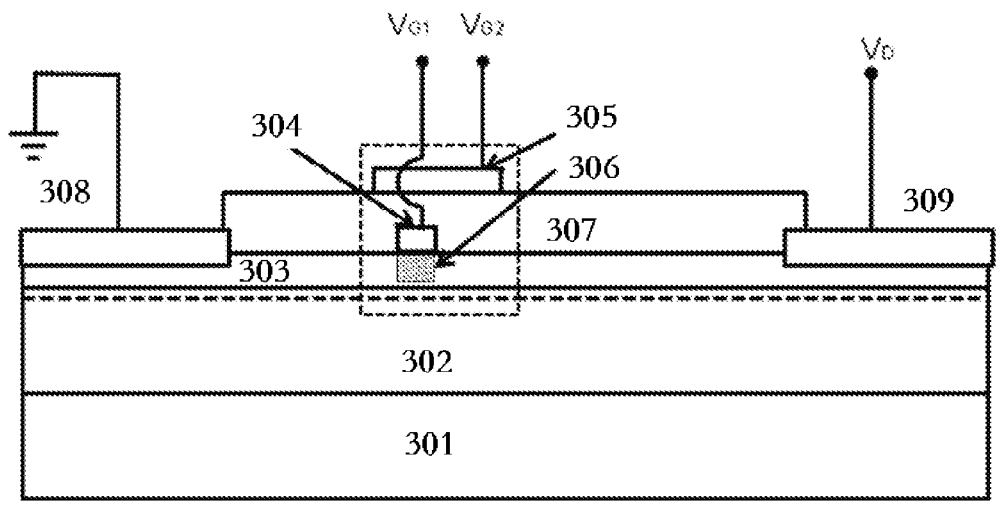
Figures 2, 3:
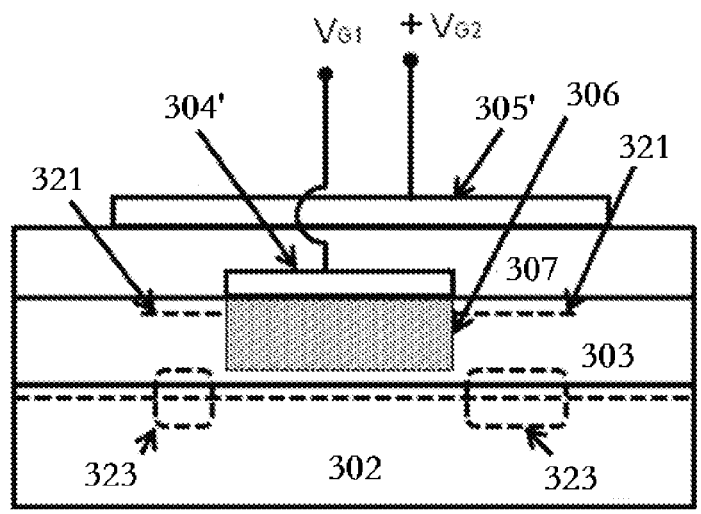
Figure 3:
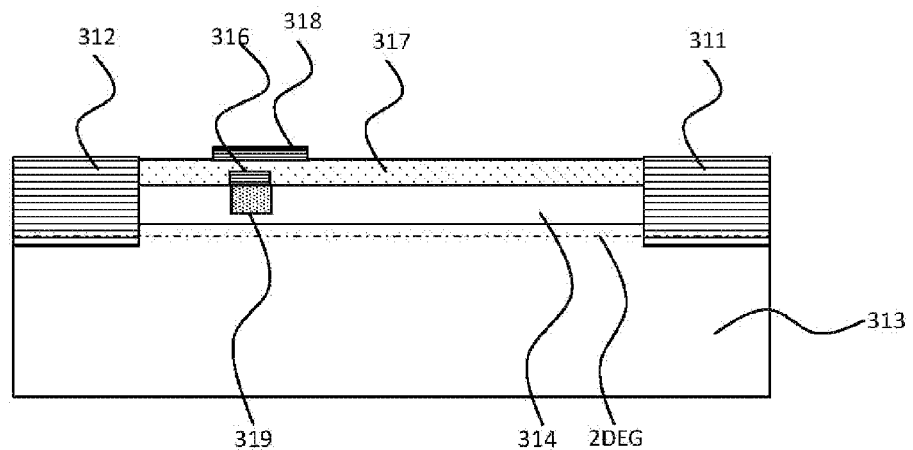
Figures 3, 4:
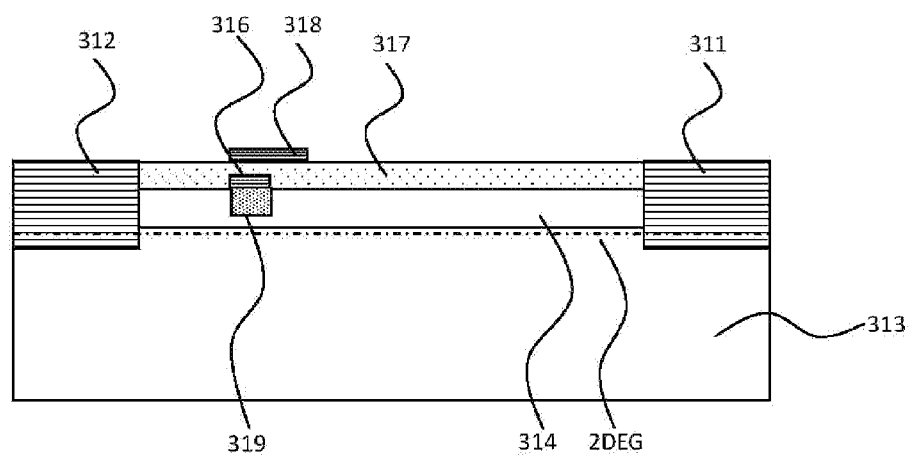
Figures 1, 4:
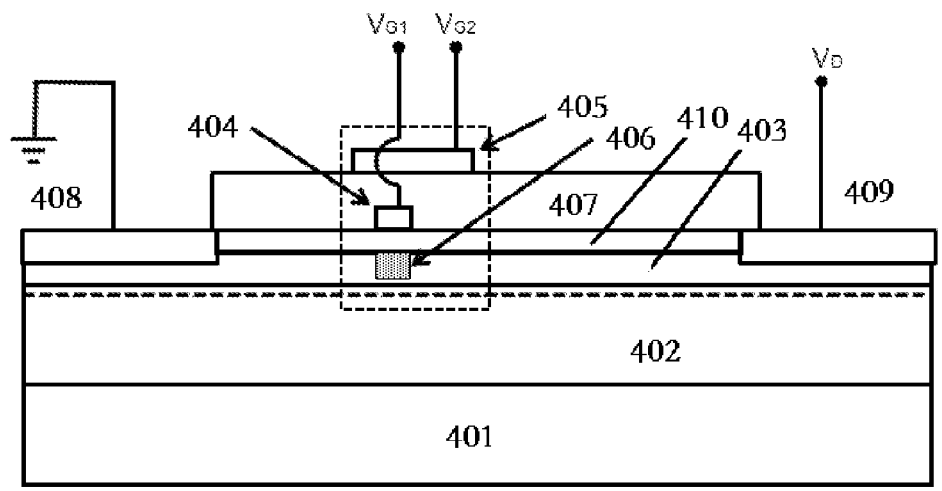
Figures 2, 4:
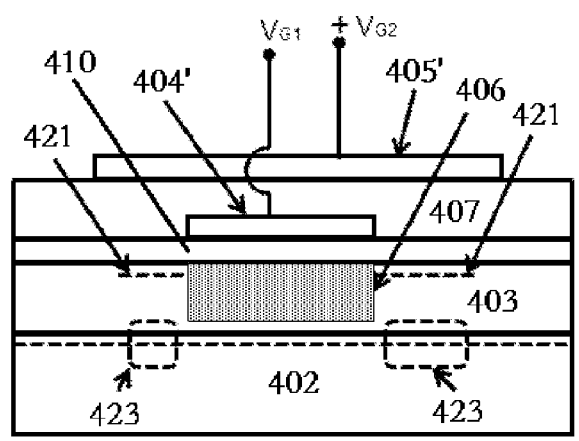
Figures 3, 4:
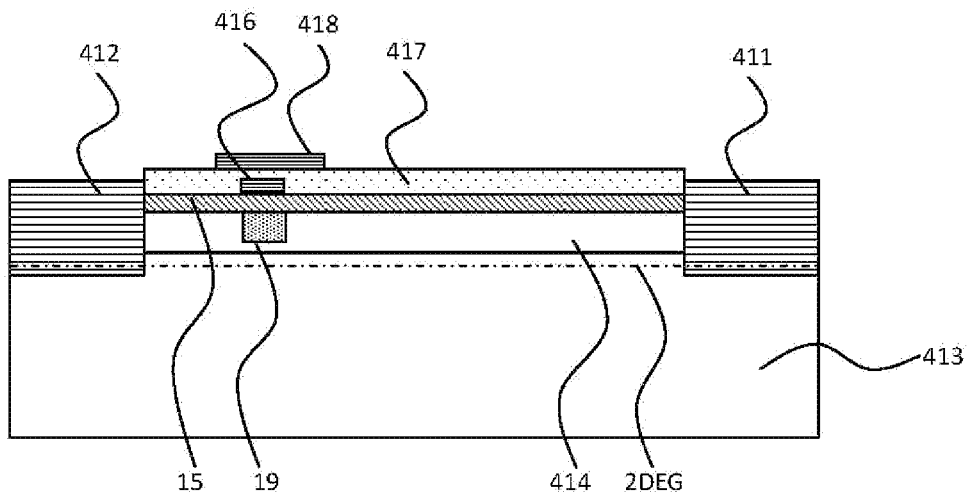
Figure 4:
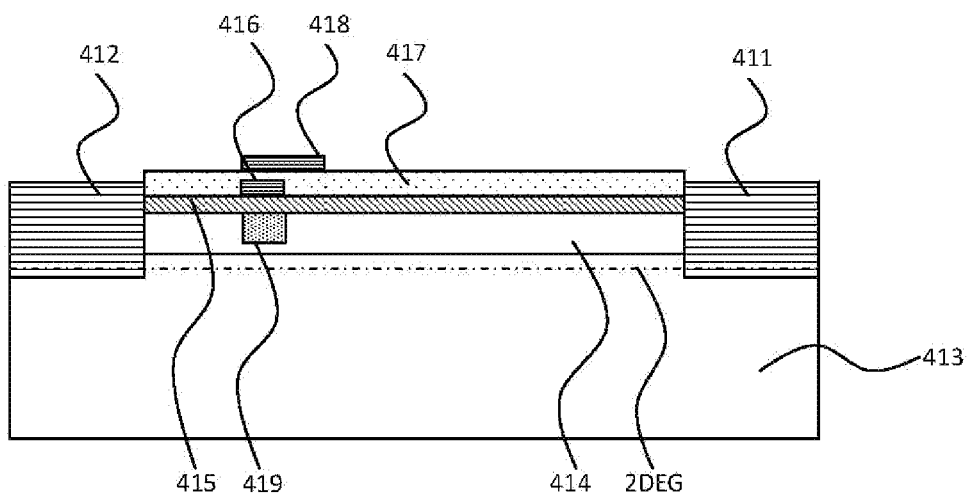

The MISHEMT device further comprises a main and top dual gate; the main gate 216 is manufactured between the source electrode and drain electrode and adjacent to one end of the source electrode; the main gate 216 forms a metal-insulator-semiconductor (MIS) structure through the first dielectric layer (such as Al2O3) and the second semiconductor. The top gate 218 is arranged on the insulating second dielectric layer 217 (such as $Si_3N_4$), and the orthographic projection overlaps with the main gate, and extends towards the directions of the source electrode and the drain electrode (or only extends towards the direction of the source electrode or the drain electrode; FIG. 2-4 shows a structure in which only extends towards the direction of the drain electrode).

The working principle of the MISHEMT device is as follows: because the band gap of the second semiconductor 214 is wider than that of the first semiconductor 213, the two-dimensional electron gas (2DEG) layer is formed on the hetero junction interface of the one side of the first semiconductor 213. When the main gate 216 is applied with a high potential, the concentration of the two-dimensional electron gas in the channel is high, and the device is in a turn-on state; When the main gate 216 is applied with a low potential, the two-dimensional electron gas in the channel is depleted, and the device is in a turn-off state; therefore, the concentration of the two-dimensional electron gas in a corresponding channel of the main gate 216 is controlled by the potential of the main gate 216, so that the on and off states of the device is controlled. an independent electrical signal control can be applied for the top gate 218. The concentration of the two-dimensional electron gas on both sides of the channels of the main gate 216 can be controlled through applying different electrical signals for the top gate 218.

Embodiment 3

Referring to FIG. 3-1, the embodiment relates to a group III nitride E-MODE HEMT device (hereinafter referred to as "an enhanced dual-gate device") with a laminated dual-gate structure, wherein a source electrode 308 and a drain electrode 309 are arranged at two sides; the surface of a second semiconductor 303 (such as AlGaN layer) adjacent to a source electrode 308 is provided with a gate electrode, called a main gate 304; a fixed negative charge region 306 treated by plasma is arranged under the main gate; an insulating dielectric layer 307 is arranged on the top of the main gate, and the top of the insulating dielectric layer is another gate electrode, called a top gate 305. As shown in FIG. 3-1, the top gate is arranged above the main gate, overlaps with two side edges of the main gate in the orthographic projection and extends towards the directions of the source electrode and the drain electrode. The first semiconductor 302 (such as GaN layer) can be arranged on a substrate 301.

Referring to FIG. 3-2, when the enhanced dual-gate device is in a turn-off state, a main gate is biased below a threshold voltage, a top gate 305 is applied with sufficiently high positive bias; although the interfaces of second semiconductor at both sides of the metal of the top gate 304 and an insulating dielectric layer can also accumulate negative charges, the electric field of the top gate cannot be completely shielded by interface negative charges because of high enough forward bias on the top gate; enough electric field is present to induce the two-dimensional electron gas in the channel so as to keep a channel 323 under the charge accumulation region to be turned on; when the voltage of the main gate rises, and the device is transformed from a turn-off state into a turn-on state, the voltage of the top gate remains constant, and the channel under the interface charge accumulation region is turned on, so the device cannot cause delay due to current collapse.

If the device works in a switching mode, the drive mode of the enhanced dual-gate device can be adopted: pulse signals are synchronically applied for the main gate and top gate; the voltage of top gate is higher than that of the main gate; when the device is transformed from a turn-off state into a turn-on state, a high voltage of the top gate can overcome the shield of the interface negative charge and forcedly induce enough two-dimensional electron gas to avoid the current collapse. It is worth noting that, in a turn-off state, the bias of the top gate can be independent with the main gate, proper bias thus the device can get a better breakdown voltage by choosing the proper bias of the top gate in a turn-off state.

Referring to FIG. 3-3, as a preferred scheme in the embodiment, the enhanced dual-gate device comprises a first semiconductor 313 (GaN) and a second semiconductor 314 (AlGaN) which is formed on the first semiconductor 313. The first semiconductor 313 is not purposely doped. The n-type impurity can be doped, or not be doped, into the second semiconductor 314. The band gap of the second semiconductor 314 is wider than that of the first semiconductor 313. The thickness of the second semiconductor 314 is about 15 to 30 nm. The heterostructure comprises a first semiconductor 313 and a second semiconductor 314, and the two-dimensional electron gas (2DEG) is formed at the interface.

The enhanced dual-gate device comprises a drain electrode 311 and a source electrode 312 that are arranged at a stated interval spacing distance. A drain electrode 311 and a source electrode 312 go through the second semiconductor 314 and extend towards to the first semiconductor 313, and are electrically connected with the two-dimensional electron gas (2DEG) in the channel. A drain electrode 311 and a source electrode 312 form an ohmic contact by multiple layers of metals (such as: Ti/Al/Ti/Au or Ti/Al/Ni/Au, etc.) through rapid high temperature annealing.

The E-MODE HEMT has a plasma processing region 319, which is a fixed negative charge region formed by performing the plasma treatment inside the second semiconductor and under the main gate, and can exhaust the two-dimensional electron gas in a corresponding channel.

The E-MODE HEMT device comprises a main and top dual-gate structure; the main gate 316 is manufactured between the source electrode and drain electrode and is adjacent to one end of the source electrode; the main gate 316 is in direct contact with the surface of the second semiconductor 314, and is in Schottky contact with the second semiconductor. The top gate 318 is arranged on the insulating dielectric layer 317 (such as Si3N4), and the orthographic projection overlaps with the main gate, and extends towards the directions of the source electrode and the drain electrode (or only extends towards the direction of the source electrode or the drain electrode; FIG. 3-4 shows a structure in which the top gate only extends towards the direction of the drain electrode).

Embodiment 4

Referring to FIG. 4-1, the embodiment relates to a group III nitride semiconductor enhanced MISHEMT device (hereinafter referred to as "an enhanced MISHEMT") with a laminated dual-gate structure, wherein the heterostructure comprises a first semiconductor and a second semiconductor, and is arranged between a source electrode 408 and a drain electrode 409; the surface of a second semiconductor is the first dielectric layer 410; the surface of a first semiconductor 410 (such as Al$_2$O$_3$) adjacent to a source electrode 408 is a gate electrode, called a main gate 404; a fixed negative charge region 406 treated by the plasma is formed under the main gate; the second dielectric layer 407 (such as Si3N4) is arranged on the top of the main gate, and the top of the second dielectric layer is another gate electrode, called a top gate 405. The top gate 405 is arranged above the main gate 404, overlaps with two side edges of the main gate in the orthographic projection and extends towards the source electrode and the drain electrode. The first semiconductor (such as GaN layer) can be arranged on a substrate 401 (such as sapphire and silicon, etc.).

Referring to FIG. 4-2, when the enhanced MISHEMT device is in a turn-off state, a main gate is biased below the threshold voltage, a top gate 405 is applied with sufficiently high positive bias; although the interfaces of second semiconductor layers at both metal sides of the main gate 404' and the first dielectric layer can accumulate negative charges, the electric field of the top gate cannot be completely shielded by interface negative charges because of high enough forward bias on the top gate; there is enough electric field to induce the two-dimensional electron gas in the channel and maintain the channel 423 under the charge accumulation region turned on; when the voltage of the main gate rises, and the device is transformed from a turn-off state into a turn-on state, the voltage of the top gate remains constant, and the channel under the interface charge accumulation region is turned on, so the device cannot cause delay due to current collapse.

If the device operates in a switching mode, the drive mode of the enhanced MISHEMT device can be adopted: pulse signals are synchronically applied respectively for the main gate and top gate; the voltage of top gate is higher than that of the main gate; when the device is transformed from a turn-off state into a turn-on state, a high voltage of the top gate can overcome the shield of the interface negative charges and forcedly induce enough two-dimensional electron gas to avoid the current collapse. It is worth noting that, in a turn-off state, the bias of the top gate can be independent with the main gate, so the device can obtain a better breakdown voltage by choosing the proper bias of top gate in a turn-off state.

Referring to FIG. 4-3, as a preferred scheme in the embodiment, the enhanced MISHEMT device comprises a first semiconductor 413 (GaN) and a second semiconductor 414 (AlGaN) which is formed on the first semiconductor 413. The first semiconductor 413 is not purposefully doped during the making process. The n-type impurity may be doped, or not be purposefully doped, into the second semiconductor 414. The band gap of the second semiconductor 414 is wider than that of the first semiconductor 413. The thickness of the second semiconductor 414 is about 15 to 30 nm. The heterostructure comprises a first semiconductor 413 and a second semiconductor 414, and the two-dimensional electron gas (2DEG) is formed at the interface.

The enhanced MISHEMT device comprises a drain electrode 411 and a source electrode 412 that are arranged at stated spacing distance. A drain electrode 411 and a source electrode 412 go through the second semiconductor 414 and extend to the first semiconductor 413, and are electrically connected with two-dimensional electron gas (2DEG) in the channel. A drain electrode 411 and a source electrode 412 form an ohmic contact by multiple layers of metal (such as: Ti/Al/Ti/Au or Ti/Al/Ni/Au, etc.) through rapid high temperature annealing.

The enhanced MISHEMT further has a plasma processing region 419, which is a fixed negative charge region formed by performing the plasma treatment inside the second semiconductor and under the main gate, and can exhaust the two-dimensional electron gas in a corresponding channel.

The enhanced MISHEMT device further comprises a main and top dual-gate structure; the main gate 416 is manufactured between the source electrode and drain electrode and is adjacent to one end of the source electrode; the top gate 416 and the second semiconductor form a metal-insulator-semiconductor (MIS) structure through the first dielectric layer 415 (such as Al2O3). The top gate 418 is arranged on the second dielectric layer 417 (such as Si3N4), and the orthographic projection overlaps with the main gate, and extends towards the directions of the source electrode and the drain electrode (or only extends towards the direction of the source electrode or the drain electrode; FIG. 4-4 shows a structure in which the top gate extends towards the drain electrode).

It should be noted that the above description and embodiments shown in the drawings cannot be resolved to define the design of the present invention. The people who hold the same knowledge in the technical field of the present invention can change or improve the design of the present invention to other forms, and these changes or improvements are also within the scope of the present invention.

What is claimed is:

1. A group III nitride high electron mobility transistor (HEMT) device, comprising: a source electrode, a drain electrode and a heterostructure, wherein the source electrode and the drain electrode are electrically connected via two-dimensional electron gas (2DEG) formed in the heterostructure; the heterostructure comprises a first semiconductor and a second semiconductor; the first semiconductor is disposed between the source electrode and drain electrode; the second semiconductor is formed on the surface of the first semiconductor and is provided with a band gap wider than the first semiconductor; the high electron mobility transistor (HEMT) device also comprises a main gate, a top gate and an insulating dielectric layer;
 the main gate is disposed at the side of the surface of the second semiconductor adjacent to the source electrode, and is in Schottky contact with the second semiconductor;
 the dielectric layer is disposed on the surfaces of the second semiconductor and the main gate is arranged between the source electrode and the drain electrode;
 the top gate is formed on the surface of the dielectric layer, at least one side edge of the top gate extends towards the direction of source electrode or the drain electrode, and the orthographic projection of the top gate overlaps with the two side edges of the main gate;
 when the HEMT device is at work, the main gate and the top gate are respectively controlled by a control signal.

2. The group III nitride high electron mobility transistor (HEMT) device according to claim 1,
 characterized in that an insulating dielectric layer comprises a first dielectric layer and a second dielectric layer,
 wherein the first dielectric layer is formed on the surface of the second dielectric layer;
 the second dielectric layer is formed on the surface of the first dielectric layer and the main gate;
 the main gate is disposed at the side of the surface of the first dielectric layer and is adjacent to the source electrode, and forms a metal-insulator-semiconductor structure with the first dielectric layer and the second semiconductor;
 the top gate is formed on the surface of the dielectric layer, at least one side edge of the top gate extends towards the direction of the source electrode or the drain electrode, and the orthographic projection of the top gate overlaps with the two side edges of the main gate.

3. The group III nitride high electron mobility transistor (HEMT) device according to claim 1 or 2, characterized in that a plasma processing region is formed inside the local region of the second semiconductor under the main gate.

4. The group III nitride high electron mobility transistor (HEMT) device according to claim 3, characterized in that the plasma processing region is a fixed negative charge region formed by performing fluorine plasma treatment on the local region in the second semiconductor.

5. The group III nitride high electron mobility transistor (HEMT) device according to claim 1 or 2, characterized in that the source electrode and the drain electrode are respectively connected to the low potential and high potential of a power supply.

6. The group III nitride high electron mobility transistor (HEMT) device according to claim 1 or 2, characterized in that the first semiconductor and the second semiconductor are both group III nitride semiconductors.

7. The group III nitride high electron mobility transistor (HEMT) device according to claim 1 or 2, characterized in that the two side edges of the top gate respectively extend towards the directions of the source electrode and the drain electrode.

8. The group III nitride high electron mobility transistor (HEMT) device according to claim 1 or 2, characterized in that only one side edge of the top gate extends towards the direction of a corresponding source electrode or drain electrode.

9. The group III nitride high electron mobility transistor (HEMT) device according to claim 1, characterized in that when the HEMT device is in a turn-on state, the potential of a control signal of the top gate is higher than that of a control signal of the main gate.

* * * * *